March 29, 1966 H. F. WELSH 3,243,113

FLUID BINARY COUNTER

Filed April 20, 1964 2 Sheets-Sheet 1

FLIP FLOP

NOR

INVERTER

March 29, 1966 H. F. WELSH 3,243,113

FLUID BINARY COUNTER

Filed April 20, 1964 2 Sheets-Sheet 2

United States Patent Office 3,243,113

Patented Mar. 29, 1966

3,243,113
FLUID BINARY COUNTER

Herbert Frazer Welsh, deceased, late of Philadelphia, Pa., by Julea S. Chapline, executrix, Philadelphia, Pa., assignor to Sperry Rand Corporation, New York, N.Y., a corporation of Delaware Filed Apr. 20, 1964, Ser. No. 361,313
13 Claims. (Cl. 235—201)

The present invention relates to binary counters and more particularly to fluid operated binary counters of the type having no moving parts other than the working fluid.

Pure fluid amplifiers have found wide use in control and data processing systems. Since the amplifiers may be made of plastic, metallic, ceramic or other material and employ no moving parts other than the fluid working medium they may be economically constructed for reliable use in devices subjected to extreme temperature conditions. Since they contain no moving parts they are not subject to wear and are faster operating than mechanical devices performing similar functions. Although slower in operation than electronic devices they are more rugged.

Therefore, an object of this invention is to provide a pure fluid operated binary counter which is suitable for use under extremely adverse environmental conditions.

Pure fluid operated binary counters are known in the art. However, one type of counter now known requires special configurations of fluid components in order to avoid undesirable characteristics such as the tendency to oscillate. The use of these special fluid components increases the cost of the counter.

Accordingly, a further object of this invention is to provide a pure fluid binary counter which is reliable and comprises only standard fluid amplifier components.

Still another object of the invention is to provide a binary counter responsive to intermittently applied fluid pulses of at least a predetermined magnitude, said counter being unresponsive to "noise" or fluid signals of less than said predetermined magnitude.

A further feature of the invention is the provision of a modulo-two counter employing two bistable fluid amplifiers, said amplifiers being interconnected by fluid logic networks whereby the output of each amplifier controls the application of count pulses to the other amplifier. This differs from some counters of the prior art which utilize artificial signal delay elements and thus place limitations on the duration and repetition rate of the count pulses.

Another object of the invention is to provide a binary counter stage responsive to fluid count signals, said counter stage having a bistable fluid amplifier, first and second means responsive to said bistable amplifier for producing first and second signals indicating the status of the bistable amplifier, and first and second fluid logic elements responsive to said first and second signals in said count signals for changing the state of said bistable amplifier.

Other objects of the invention and its mode of operation will become apparent upon consideration of the following description and the accompanying drawing in which.

Figure 1:
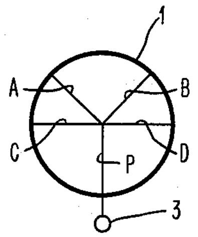
FIGURE 1 shows the logic symbol employed to represent a bistable fluid amplifier.

The logic symbol shown in FIGURE 1 represents a conventional fluid flip-flop or bistable fluid amplifier. Amplifier 1 may take any one of several known forms and may, for example, be of the type shown on page 20 of the publication entitled, "Proceedings of the Fluid Amplification Symposium," October 1962, volume 1, and available through the Office of Technical Services of the U.S. Department of Commerce.

Amplifier 1 has a power stream input nozzle 1P, first and second output channels 1A and 1B, and first and second control nozzles 1C and 1D. The power stream input nozzle 1P is connected to a fluid source which supplies fluid to the nozzle at a substantially constant rate. The fluid source may be of conventional design and for the sake of clarity is not shown. It will be understood that the power stream fluid is applied to the nozzle through terminal connection 3.

Amplifier 1 has a first stable state, also designated the "reset" or "zero" state, represented by flow of power stream fluid from nozzle 1P out of the amplifier through output channel 1A, and a second stable state, also designated the "set" or "one" state, represented by flow of power stream fluid from nozzel 1P through output channel 1B. The amplifier may be switched from the reset to the set state by applying a fluid signal to "set" control nozzle 1C. Once the power stream assumes the set state it maintains that state until the fluid control signal is applied to "reset" control nozzle 1D. A fluid control signal applied to nozzle 1D switches the power stream of the amplifier from the second to the first stable state and this condition of flow is maintained until another fluid signal is applied to control nozzle 1C.

Figure 2:
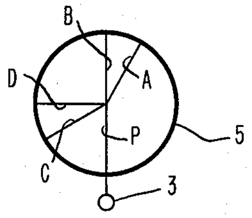
FIGURE 2 shows the logic symbol employed to represent a fluid amplifier NOR circuit.

The symbol shown in FIGURE 2 represents a conventional fluid amplifier NOR circuit. Amplifier 5 has a power stream input nozzle 5P, first and second output channels 5A and 5B, and first and second control signal input nozzles 5C and 5D. The power stream input nozzle is connected at 3 to a continuous source of fluid and the amplifier is geometrically biased so that in the absence of fluid signals at nozzles 5C and 5D the power stream fluid flows out of the amplifier through output channel 5B. If a fluid control signal is applied to nozzle 5C or to nozzle 5D, or to both nozzles simultaneously, then the power stream fluid is deflected into output channel 5A. The amplifier is monostable with the power stream remaining in or returning to its normal path of flow into output channel B during those periods of time when no signals are applied to either of the control nozzles. In the following description, a NOR circuit is considered to be disabled or inhibited if its power stream is deflected into output channel A. The NOR circuits used herein may, for example, be of the type shown and described on page 408 of the above mentioned publication.

Figure 3:
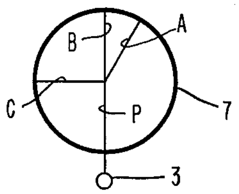
FIGURE 3 shows the logic symbol employed to represent a fluid amplifier-inverter.

FIGURE 3 shows the symbol employed to represent a conventional fluid amplifier-inverter having a single input. The amplifier 7 has a power stream input nozzle 7P, first and second output channels 7A and 7B, and a single control signal input nozzle 7C. Preferably, the amplifier is geometrically biased so that in the absence of a fluid signal at nozzle 7C the power stream entering the amplifier through nozzle 7P flows through output channel 7B. When a fluid signal is applied to control nozzle 7C it deflects the power stream so that the power stream flows into output channel 7A. The amplifier is monostable in that the power stream returns to its normal path of flow into channel 7B as soon as the control signal at nozzle 7C is terminated. Amplifier 7 may be constructed in the same manner as NOR circuit 5, the only difference being that the amplifier is provided with only one control nozzle.

Figure 4:
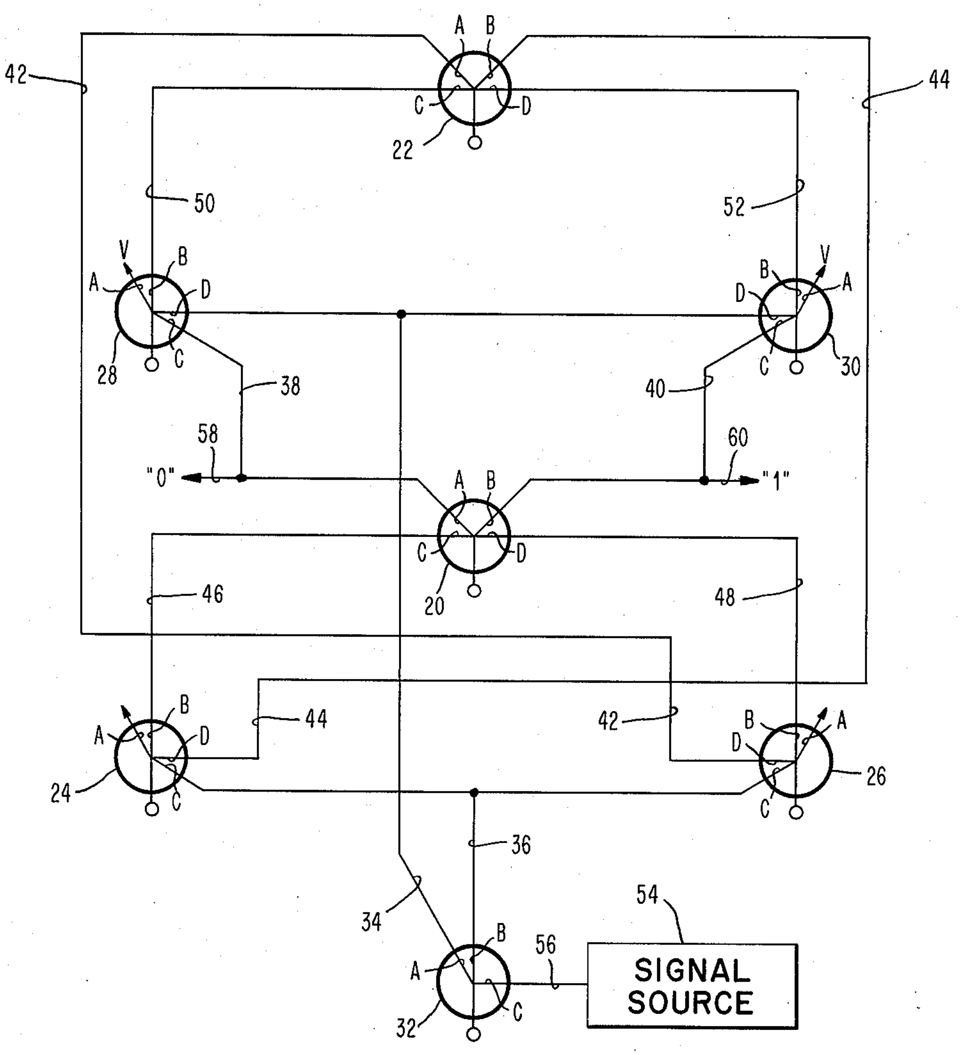
FIGURE 4 is a logical diagram of a modulo-two counter constructed in accordance with the principles of the present invention.

Referring now to FIGURE 4, a single binary counter stage comprises first and second bistable fluid amplifiers 20 and 22, first, second, third, and fourth NOR circuits 24, 26, 28, and 30, an a fluid amplifier-inverter 32.

Output channel 32A is connected by means of a pipe 34 to control signal inputs 28D and 30D and output channel 32B is connected by means of a pipe 36 to control signal inputs 24C and 26C. The term "pipe" as used herein denotes a pipe, channel, tube, duct or other suitable means for conveying fluid signals.

Bistable amplifier 20 has an output channel 20A connected by means of a pipe 38 to control signal input 28C and an output channel 20B connected by means of a pipe 40 to control signal input 30C. Flip-flop 22 has an output channel 22A connected by means of a pipe 42 to control signal input 26D and an output channel 22B connected by means of a pipe 44 to control signal input 24D. Output channels 24B, 26B, 28B, and 30B of the NOR circuits are connected to control signal inputs 20C, 20D, 22C, and 22D, respectively by means of pipes 46, 48, 50, and 52.

Output channels 24A, 26A, and 30A of the NOR circuits are shown in the drawing as being vented to the atmosphere at points V. Alternatively, these output channels may be connected by means of pipes to the return side of the source (not shown) which supplies power stream fluid to each of the logical elements.

A signal source 54 generates the fluid signals to be counted and these signals are applied by means of a pipe 56 to the control signal input 32C of the amplifier-inverter. Signal source 54 may comprise any suitable means for producing fluid count signals and may, for example, comprise another binary counter stage similar to that shown in FIGURE 4. As will become obvious from the subsequent description, the counter shown in FIGURE 4 accurately counts the number of input signals appearing on pipe 56 even though the signals occur randomly and may vary in duration.

The state of bistable amplifier 20 determines the count stored in the counter stage. When amplifier 20 is in the reset condition is power stream flows through output channel 20A and a portion of this fluid may be conveyed over a pipe 58 to an indicator or other suitable output device. When amplifier 20 is in the set state its power stream flows through output channel 20B and a portion of this fluid may be conveyed over a pipe 60 to an indicator or other output device. The output device may, for example, be a succeeding counter stage similar to the one shown.

On the other hand, the state of bistable amplifier 22 bears no relationship to the count stored in the counter state. As subsequently explained, bistable amplifier 22 senses the output of amplifier 20 and assumes the same state. Then, when the next count pulse occurs amplifier 22 controls NOR circuits 24 and 26 so that amplifier 20 is switched to the opposite state from that of amplifier 22.

The counter stage shown in FIGURE 4 operates as follows. Before signal source 54 produces the first count signal, bistable amplifier 20 is in the reset state with its power stream flowing out through channel 20A. A portion of this power stream flows through pipe 38 and into nozzle 28C thus deflecting the power stream of NOR circuit 28 so it flows through channel 28A to the vent. Before the first count signal is generated there is no fluid flow from pipe 56 into control nozzle 32C so the power stream of amplifier-inverter 32 flows through pipe 36 and into nozzles 24C and 26C thus deflecting the power streams of NOR circuits 24 and 26 so that they flow to the vents. No fluid is applied to either of the control nozzles 30D or 30C so the power stream of NOR circuit 30 flows through channel 30B and pipe 52 to control nozzle 22D thus applying a reset signal to bistable amplifier 22. The power stream of amplifier 22 flows through output channel 22A and pipe 42 to control nozzle 26D thus providing an additional signal for deflecting the power stream of NOR circuit 26 to the vent.

Figure 5:
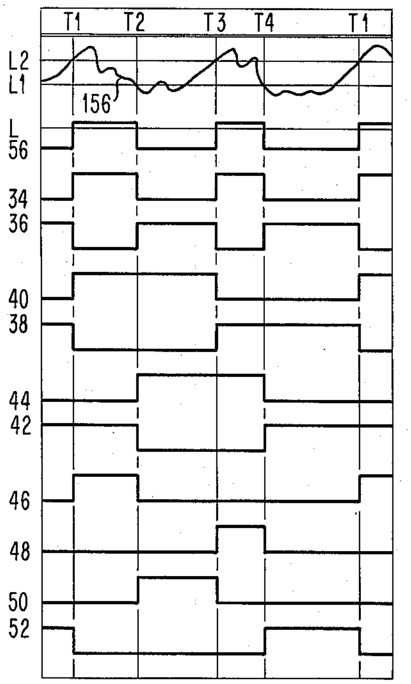
FIGURE 5 is an idealized waveform diagram illustrating the operation of a single counter stage.

When signal source 54 produces the first count signal fluid flows through pipe 56 to control nozzle 32C of the amplifier-inverter. This is illustrated in FIGURE 5 where the waveform 56 changes from a low to a high level at time T1. The count signal applied to nozzle 32C deflects the power stream of the amplifier-inverter so that it stops flowing in the pipe 36 and begins flowing into pipe 34.

The power stream fluid entering pipe 34 is applied to control nozzles 28D and 30D thus deflecting the power streams of NOR circuits 28 and 30 to the vents.

When the flow of fluid in the pipe 36 ceases at time T1 control fluid stops flowing into nozzles 24C and 26C. The power stream of NOR circuit 26 continues to flow to the vent since it is still being deflected by control fluid applied to nozzle 26D.

At time T1 when control fluid stops flowing into nozzle 24C the power stream of NOR circuit 24 switches so that it flows into output channel 24B. The reason for this is that the NOR circuit is geometrically biased so that the power stream assumes this path of flow when no control signals are applied to either of the nozzles 24C and 24D.

The power stream of NOR circuit 24 flows through pipe 46 to control nozzle 20C and deflects the power stream of bistable amplifier 20 so that the amplifier 20 switches from the reset to the set state. Therefore, at time T1 fluid flow through pipe 38 to nozzle 28C ceases and fluid flow through pipe 40 to nozzle 30C begins.

The first count signal ends at time T2. This is illustrated in FIGURE 5 where the waveform 56 jumps from a high value to a low value at time T2. When the first count signal ends fluid stops flowing into control nozzle 32C and the power stream of amplifier-inverter 32 switches so that it again flows through pipe 36 to nozzles 24C and 26C. The flow of fluid into nozzle 26C has no effect since the power stream NOR circuit 26 is already being deflected to the vent by fluid being applied to the nozzle 26D. However, the fluid applied to nozzle 24C deflects the power stream of NOR circuit 24 so that it again flows to the vent.

When fluid ceases flowing into pipe 34 at time T2 the control signals at nozzles 28D and 30D terminate. Termination of the control signal at nozzle 30D has no effect on NOR circuit 30 since the output of amplifier 20 is being applied to control nozzle 30C to deflect the power stream to the vent.

At time T2 the power stream of NOR circuit 28 switches to output channel 28B since no input signals are being applied to either nozzle 28C or 28D. The power stream of NOR circuit 28 flows through pipe 50 to nozzle 22C to set bistable amplifier 22. Therefore, shortly after time T2 fluid stops flowing through pipe 42 to nozzle 26D and begins flowing through pipe 44 to nozzle 24D. The power streams from NOR circuits 24 and 26 are not affected by this change in signals since they are being deflected to the vents by the output of amplifier-inverter 32.

This completes the response of the counter stage to the first count pulse. No further changes in flow occur until the next count signal is produced by source 54.

The second count signal is applied to amplifier-inverter 32 at time T3 and deflects the power stream into output channel 32A. The power stream flows through pipe 34 to control nozzles 28D and 30D. The fluid applied to nozzle 30D has no effect since the output of amplifier 20 is already deflecting the power stream of NOR circuit 30 to the vent. The fluid applied to nozzle 28D deflects the power stream of NOR circuit 28 to the vent.

When the amplifier-inverter 32 switches at time T2 it no longer supplies supplies fluid to control nozzles 24C and 26C. NOR circuit 24 is receiving a signal over pipe 44 from amplifier 22 which keeps the power stream of NOR circuit 24 deflected into output channel 24A. However, NOR circuit 26 is not receiving a signal at nozzle 26D so when fluid stops flowing to nozzle 26C the power stream of this NOR circuit returns to its normal state and flows through channel 26B and pipe 48 to nozzle 20D to switch bistable amplifier 20 to its reset state. The switching of bistable amplifier 20 has no effect on NOR circuits 28 and 30 since the power streams of these circuits are still being deflected to the vents by the output signal from amplifier-inverter 32.

The second count signal terminates at time T4 thus permitting the power stream of amplifier-inverter 32 to switch back to output channel 32B. The power stream of the amplifier-inverter flows through pipe 36 to control nozzles 24C and 26C to insure that the power streams of NOR circuits 24 and 26 are deflected to the vents.

When amplifier-inverter 32 switches back to its normal state at time T4 it ceases supplying fluid to control nozzles 28D and 30D. Since bistable amplifier 20 is in the reset state it is supplying an output signal to nozzle 28C which continues to deflect the power stream of NOR circuit 28 to the vent. Neither of the control signal input nozzles for NOR circuit 30 is receiving fluid so the power stream of this circuit switches to output channel 30B and flows through pipe 52 to input nozzle 22B. This resets bistable amplifier 22. Therefore, shortly after time T4 amplifier 22 ceases control fluid to nozzle 24D through pipe 44 and begins supplying control fluid through pipe 42 to control nozzle 26D.

This completes one cycle of operation of the counter stage. Each succeeding pair of count signals causes a similar cycle of operation. Thus, the first and each succeeding odd numbered count signal sets bistable amplifier 20 to represent a binary 1 and the second and succeeding even numbered count signals reset bistable amplifier 20 to represent binary 0.

In the above description it has been assumed that signal source 54 is either "on" or "off" and causes fluid flow in pipe 56 only when it is "on" i.e., when it is producing a count signal. A illustrated by waveforms 34, 36, and 46 the power stream of inverter-amplifier 32 switches each time the signal source is turned on or off thus causing the signal in pipe 56 to cross a predetermined threshold level L. Any signal magnitude above L is sufficient to deflect the power stream of amplifier-inverter 32 into channel 32A while any signal magnitude less than L permits the power stream to flow into channel 32B. It is well known that the value of L required to deflect the power stream is determined by many parameters such as the size of the power stream of amplifier 32, the fluid employed, the internal configuration of the amplifier and so forth.

Further, it is known that by proper design of the internal configuration of a fluid amplifier it may be made to exhibit a differential set-reset characteristic. Generally speaking this is accomplished by designing the amplifier such that the well known boundary layer effect is quite large but not large enough to cause bistable operation.

For example, amplifier 7 of FIGURE 3 may exhibit a large boundary layer effect tending to hold the power stream in a path of flow into channel 7B. A relatively small fluid control signal applied to nozzle 7C may be insufficient to overcome the boundary layer effect and cause the power stream to switch. If the control signal is slowly increased in magnitude it will eventually reach a level L2 at which it overcomes the boundary layer effect that causes the power stream to flow into channel 7B. At this time the power stream switches over and flows into channel 7A.

When the power stream switches to channel 7A a new boundary layer is created, this one tending to hold the power stream so that it flows into channel 7A. However, the configuration of the amplifier is such that this boundary layer is not sufficient to hold the power stream directed into channel 7A without an aiding force produced by a control signal from channel 7C. If the control signal applied to 7C is slowly decreased in magnitude the power stream continues to flow into channel 7A until the magnitude of the control signal drops below a level L1. The power stream switches back to channel 7B when the magnitude of the control signal becomes less than L1.

Waveform 156 of FIGURE 5 represents the output of signal source 54 including "noise" signals which may be present under actual operating conditions. With a signal of this type it is preferable that amplifier-inverter 32 have a differential set-reset characteristic as described above. The counter stage (with the exception of amplifier 32) functions in exactly the same manner as described above.

Each time source 54 produces a count signal the magnitude of the signal 156 exceeds L2 and the power stream of the amplifier-inverter is deflected into channel 32A. At the termination of each count pulse the magnitude of signal 156 drops below L1 and the power stream of amplifier 32 returns to output 32. "Noise" signals not exceeding L2 will not actuate the counter. Furthermore, even though the magnitude of the count signal may temporarily drop below the level L2 and then increase above that level as a result of "noise" an erroneous count will not be entered into the counter. This is illustrated by waveform 156 which drops below, and then rises above L2 between times T3 and T4 without affecting any of the logic elements of the counter stage.

While a specific embodiment has been shown and described herein, various modifications and subtsitutions falling within the spirit of the invention described herein will be obvious to those of ordinary skill in the art. It is intended therefore to be limited only by the scope of the appended claims.

The embodiments of the invention in which an exclusive property or privilege is claimed are defined as follows:

1. A binary counter comprising: means for generating a series of count signals to be counted; a bistable fluid amplifier having a set state and a reset state; first fluid logic circuit means responsive to said bistable amplifier and said count signals for producing first and second signals indicative of said set and reset states, respectively; second fluid logic circuit means responsive to said count signals and said first signals for resetting said bistable amplifier; and third fluid logic circuit means responsive to said count signals and said second signals for setting said bistable amplifier.

2. A binary counter as claimed in claim 1 and further comprising means for sensing the state of said bistable amplifier.

3. A binary counter as claimed in claim 1 wherein said second and third fluid logic circuit means each comprises a fluid amplifier NOR circuit.

4. A binary counter comprising: first and second bistable fluid amplifiers each having a set state and a reset state; source means for producing fluid count signals; means responsive to said count signals for producing a first and a second series of fluid signals to be counted; first fluid logic circuit means responsive to said first amplifier and said first series of signals for setting said second amplifier if said first amplifier is set and for resetting said second amplifier if said first amplifier is reset; and second fluid logic circuit means responsive to said second amplifier and said second series of signals for setting said first amplifier if said second amplifier is reset and for resetting said first amplifier if said second amplifier is set.

5. A binary counter as claimed in claim 4 wherein said means responsive to said count signals comprises a further fluid amplifier having a continuous power stream, first and second outputs, and nozzle means responsive to said count signals for selectively deflecting said power stream between said outputs to produce said first and second series of signals.

6. A binary counter a claimed in claim 5 wherein said further fluid amplifier has a differential set-reset characteristic.

7. A binary counter comprising: a signal source for producing a sequence of fluid count signals; means responsive to said count signals for producing first and second series of fluid inhibit signals; first and second fluid amplifiers each having a set and a reset state and a set and a reset input; first logical gating means responsive to the reset state of said second amplifier for applying a set signal to said first amplifier; second logical gating means responsive to the set state of said second amplifier for applying a reset signal to said first amplifier; third logical gating means responsive to the set state of said first amplifier for applying a set signal to said second amplifier; fourth logical gating means responsive to the reset state of said first amplifier for applying a reset signal to said second amplifier; and means for alternately applying a signal of said first series of inhibit signals to said first and second gating means or a signal of said second series of inhibit signals to said third and fourth gating means.

8. A binary counter as claimed in claim 7 wherein each of said gating means comprises a pure fluid amplifier NOR circuit.

9. The combination comprising: first and second bistable fluid amplifiers each having a set state and a reset state; first fluid logical gating means responsive to said first amplifier for switching said second amplifier to the same state as said first amplifier; second fluid logical gating means responsive to said second amplifier for switching said first amplifier to the opposite state from said second amplifier; a source of fluid signals; and means responsive to said fluid signals for alternately enabling said first gating means while disabling said second gating means and disabling said firt gating mean while enabling said second gating means; and output means connected to at least one of said amplifiers.

10. The combination comprising: first and second bistable fluid amplifiers each having a set state manifested by flow of an applied power stream to a first output and a reset state manifested by flow of an applied power stream to a second output; said bistable amplifiers further including first and second control nozzles for switching said amplifiers from one stable state to the other; first, second, third, and fourth monostable fluid amplifiers each having a stable state manifested by flow of an applied power stream to an output and first and second control nozzles responsive to fluid flow therein for deflecting the power stream away from said output; a plurality of connecting means connecting the first output of said first bistable amplifier to the first control nozzle of said first monostable amplifier, the second output of said first bistable amplifier to the first control nozzle of said second monostable amplifier, the first output of said second bistable amplifier to the first control nozzle of said fourth monostable amplifier, the second output of said second bistable amplifier to the first control nozzle of said third monostable amplifier, the output of said first monostable amplifier to the first control nozzle of said second bistable amplifier, the output of said second monostable amplifier to the second control nozzle of said second bistable amplifier, the output of said third monostable amplifier to the first control nozzle of said first bistable amplifier, and the output of said fourth monostable amplifier to the second control nozzle of said first bistable amplifier; and means for alternately applying fluid to either the second control nozzles of said first and second monostable amplifiers or the second control nozzles of said third and fourth monostable amplifiers.

11. The combination as claimed in claim 10 wherein said means for alternately applying fluid comprises: a further fluid amplifier having first and second outputs; said further amplifier being biased whereby a power stream applied thereto normally flows to said first output; a control nozzle responsive to applied fluid for directing the power stream of said further amplifier to the second output of said further amplifier; and means connecting the first output of said further amplifier to the second control nozzles of said third and fourth monostable amplifiers and the second output of said further amplifier to the second control nozzles of said first and second monostable amplifiers.

12. The combination as claimed in claim 11 and further comprising means for applying power streams to all of said amplifiers and means for intermittently applying fluid to the control nozzle of said further amplifier.

13. The combination as claimed in claim 12 wherein said further amplifier has a differential set-reset characteristic.

References Cited by the Examiner

FOREIGN PATENTS

| | | |
|---|---|---|
| 674,665 | 11/1963 | Canada. |
| 1,278,781 | 11/1961 | France. |

OTHER REFERENCES

Gray et al., "Fluid Amplifiers," Control Engineering, February 1964, pages 57–64.

Mitchell, "Fluid Binary Counter," IBM Technical Disclosure Bulletin, volume 6, No. 2, July 1963, page 30.

Grubb, "Fluid Logic Shift Register," IBM Technical Disclosure Bulletin, volume 6, No. 2, June 1963, page 24.

Wood et al., "Fluid Computers," International Science and Technology, No. 23, November 1963, pages 44–52.

LOUIS J. CAPOZI, *Primary Examiner.*

LEO SMILOW, W. F. BAUER, *Assistant Examiners.*